(12) United States Patent
Hopkins et al.

(10) Patent No.: US 11,948,639 B2
(45) Date of Patent: Apr. 2, 2024

(54) METHODS INCLUDING A METHOD OF FORMING A STACK AND ISOTROPICALLY ETCHING MATERIAL OF THE STACK

(71) Applicant: Micron Technology, Inc., Boise, ID (US)

(72) Inventors: John D. Hopkins, Meridian, ID (US); Alyssa N. Scarbrough, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 272 days.

(21) Appl. No.: 17/368,395

(22) Filed: Jul. 6, 2021

(65) Prior Publication Data
US 2023/0011135 A1 Jan. 12, 2023

(51) Int. Cl.
*H10B 41/27* (2023.01)
*G11C 16/04* (2006.01)
(Continued)

(52) U.S. Cl.
CPC .... *G11C 16/0483* (2013.01); *H01L 29/40114* (2019.08); *H01L 29/40117* (2019.08);
(Continued)

(58) Field of Classification Search
CPC .... H01L 29/4011–42344; H10B 69/00; H10B 53/00; H10B 53/10; H10B 53/20;
(Continued)

(56) References Cited

U.S. PATENT DOCUMENTS

| 8,952,443 | B2 * | 2/2015 | Chang | H10B 43/20 |
| | | | | 257/302 |
| 2018/0138194 | A1 * | 5/2018 | Shigemura | H01L 23/528 |
| 2020/0168622 | A1 * | 5/2020 | Fukuzumi | H10B 43/10 |

* cited by examiner

*Primary Examiner* — Didarul A Mazumder
*Assistant Examiner* — Gustavo G Ramallo
(74) *Attorney, Agent, or Firm* — Wells St. John P.S.

(57) ABSTRACT

A method used in forming a memory array comprising strings of memory cells comprises forming a stack comprising vertically-alternating first tiers and second tiers comprising laterally-spaced memory-block regions having horizontally-elongated trenches there-between. Two of the first tiers have different vertical thicknesses relative one another. Channel-material strings of memory cells extend through the first tiers and the second tiers. Through the horizontally-elongated trenches, first conductive material is formed in void space in the two first tiers. The first conductive material fills the first tier of the two first tiers that has a smaller of the different vertical thicknesses in individual of the memory-block regions. The first conductive material less-than-fills the first tier of the two first tiers that has a larger of the different vertical thicknesses in the individual memory-block regions. Through the horizontally-elongated trenches, the first conductive material is isotropically etched from the first tier having the larger vertical thickness in the individual memory-block regions to leave the first conductive material in the first tier having the smaller vertical thickness in the individual memory-block regions. After the isotropically etching of the first conductive material and through the horizontally-elongated trenches, second conductive material is formed in the first tier having the larger vertical thickness in the individual memory-block regions. Other embodiments, including structure independent of method, are disclosed.

29 Claims, 17 Drawing Sheets

(51) Int. Cl.
  *H01L 21/28*  (2006.01)
  *H01L 29/423*  (2006.01)
  *H10B 41/10*  (2023.01)
  *H10B 41/35*  (2023.01)
  *H10B 43/10*  (2023.01)
  *H10B 43/27*  (2023.01)
  *H10B 43/35*  (2023.01)
(52) U.S. Cl.
  CPC .. *H01L 29/42328* (2013.01); *H01L 29/42344* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)
(58) Field of Classification Search
  CPC ........ H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
  See application file for complete search history.

METHODS INCLUDING A METHOD OF FORMING A STACK AND ISOTROPICALLY ETCHING MATERIAL OF THE STACK

TECHNICAL FIELD

Embodiments disclosed herein pertain to to integrated circuitry comprising a memory array comprising strings of memory cells and to methods including, for example, a method used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between, A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Figure 1:
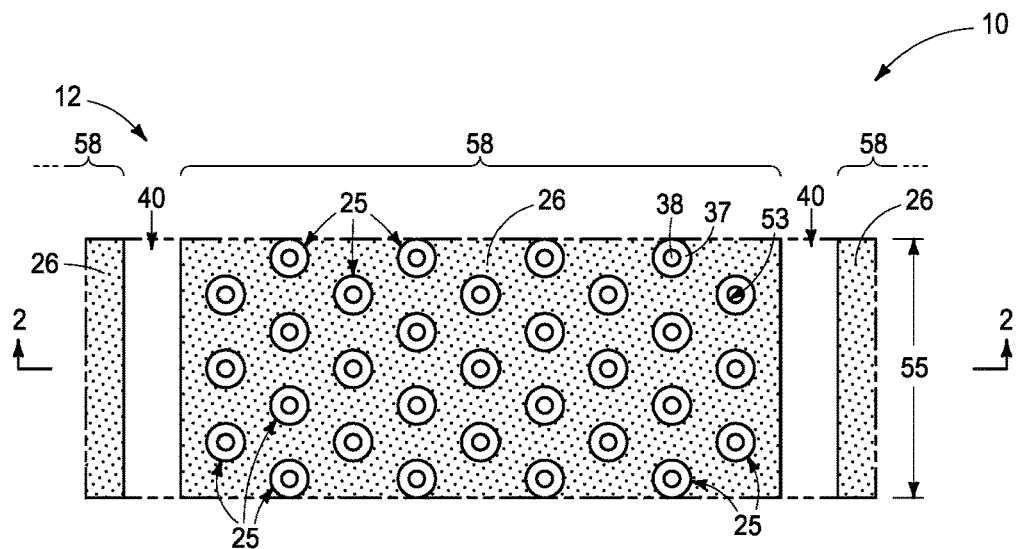
FIGS. 1-4 are diagrammatic cross-sectional views of portions of what will be an array of elevationally-extending strings of memory cells in accordance with an embodiment of the invention.

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-13 which may be considered as a "gate-last" or "replacement-gate" process, and starting with FIGS. 1-4.

FIGS. 1-4 show a construction 10 having an array or array area 12 in which elevationally-extending strings of transistors and/or memory cells will be formed. Construction 10 comprises a base substrate 11 having any one or more of conductive/conductor/conducting, semiconductive/semi-conductor/semiconducting, or insulative/insulator/insulating (i.e., electrically herein) materials. Various materials have been formed elevationally over base substrate 11. Materials may be aside, elevationally inward, or elevationally outward of the depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 is above substrate 11. Conductor tier 16 may comprise part of control circuitry (e.g., peripheral-under-array circuitry and/or a common source line or plate) used to control read and write access to the transistors and/or memory cells that will be formed within array 12. A vertical stack 18 comprising vertically-alternating insulative tiers 20* and conductive tiers 22* is above conductor tier 16 (an * being used as a suffix to be inclusive of all such same-numerically-designated components that may or may not have other suffixes). In some embodiments, conductive tiers 22* are referred to as first tiers 22* and insulative tiers 20* are referred to as second tiers 20*. First tiers 22* may not be conductive and second tiers 20* may not be insulative at this point of processing. Example first tiers 22* and second tiers 20* comprise different composition materials 26 and 24 (e.g., silicon nitride and silicon dioxide), respectively. Example thickness for each of tiers 20* and 22* is 22 to 60 nanometers. The example uppermost tier 20* may be thicker/thickest compared to one or more other tiers 20* and/or 22*. Only a small number of tiers 20* and 22* is shown, with more likely stack 18 comprising dozens, a hundred or more, etc. of tiers 20* and 22*. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22* and/or above an uppermost of the conductive tiers 22*. For example, one or more select gate tiers (not shown) may be between conductor tier 16 and the lowest conductive tier 22* and one or more select gate tiers may be above an uppermost of conductive tiers 22* (not shown). Alternately or additionally, at least one of the depicted uppermost and lowest conductive tiers 22* may be a select gate tier.

Channel openings 25 have been formed (e.g., by etching) through insulative tiers 20* and conductive tiers 22* to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58. In this document, "block" is generic to include "sub-block". Memory-block regions 58 may be considered as being longitudinally elongated and oriented, for example along a direction 55. Any alternate existing or future-developed arrangement and construction may be used.

Example memory-block regions 58 are shown as at least in part having been defined by horizontally-elongated trenches 40 that were formed into stack 18 (e.g., by anisotropic etching). Trenches 40 will typically be wider than channel openings 25 (e.g., 10 to 20 times wider, yet such wider degree not being shown in FIGS. 1 and 2 for brevity). Trenches 40 may have respective bottoms that are directly against conductor material 17 (e.g., atop or within) of conductor tier 16 (as shown) or may have respective bottoms that are above conductor material 17 of conductor tier 16 (not shown).

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

In one embodiment and as shown, charge-blocking material 30, storage material 32, and charge-passage material 34 have been formed in individual channel openings 25 elevationally along insulative tiers 20* and conductive tiers 22*. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20* and conductive tiers 22* and comprise individual operative channel-material strings 53 in one embodiment having memory-cell materials (e.g., 30, 32, and 34) there-along and with material 24 in insulative tiers 20* being horizontally-between immediately-adjacent channel-material strings 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 2:
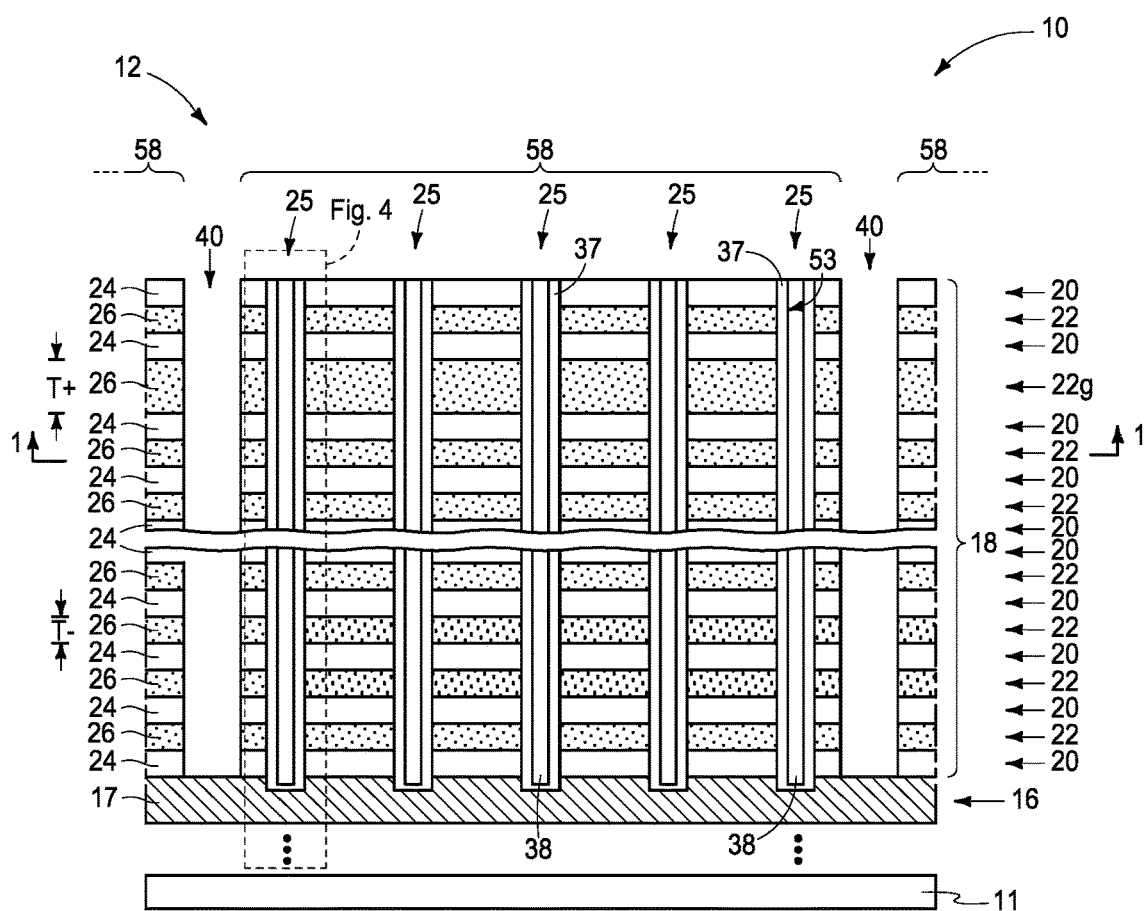
Figure 3:
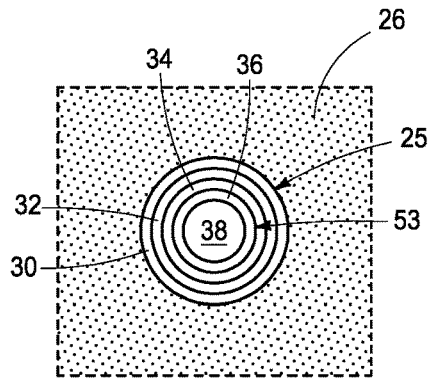
Figure 4:
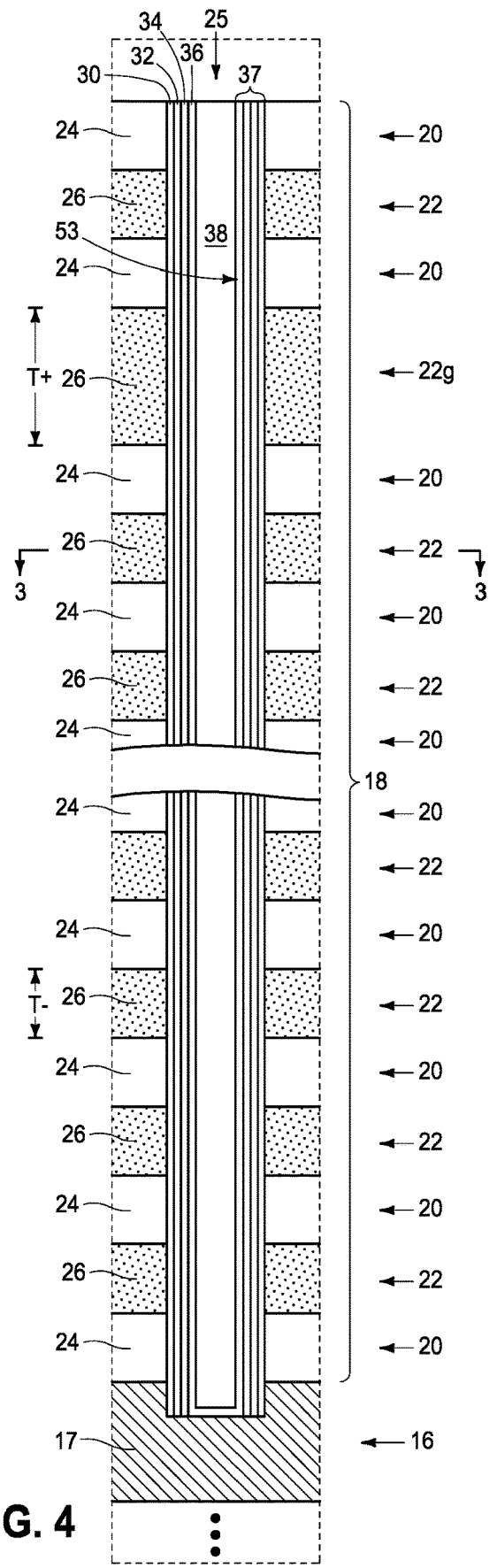

Two of first tiers 22* (at least two) have different vertical thicknesses relative one another. FIGS. 2 and 4 for simplicity and clarity show a single first tier 22g having a larger vertical thickness T+ compared to a smaller vertical thickness T− of all other first tiers 22 of the different vertical thicknesses in individual of memory-block regions 58. More and/or varied thicker first tiers 22* and/or more and/or varied thinner first tiers 22* may be provided (neither being shown in FIGS. 1-4). Regardless, in one embodiment, the first tier having the larger vertical thickness (not necessarily the largest in stack 18) in the individual memory-block regions is a select gate tier that is above or below the memory cells being formed (e.g., all of them). Regardless, in one embodiment, the first tier having the larger vertical thickness in the individual memory-block regions is an operative wordline tier (i.e., a wordline tier having operative wordlines therein that are part of individual operable memory cells). Regardless, in one embodiment, the first tier having the larger vertical thickness in the individual memory-block regions is a dummy wordline tier. In this document, a dummy wordline tier contains dummy wordlines which are gate lines that do not operate as part of operable memory cells but are operable as a conductive gate to increase conductivity of a region of channel material 36 than would otherwise occur in the same region but in the absence of such operating conductive gate. In one embodiment and as shown, multiple first tiers 22 have smaller of the different vertical thicknesses in individual memory-block regions 58 (regardless of whether all smaller thicknesses are the same).

Figure 5:
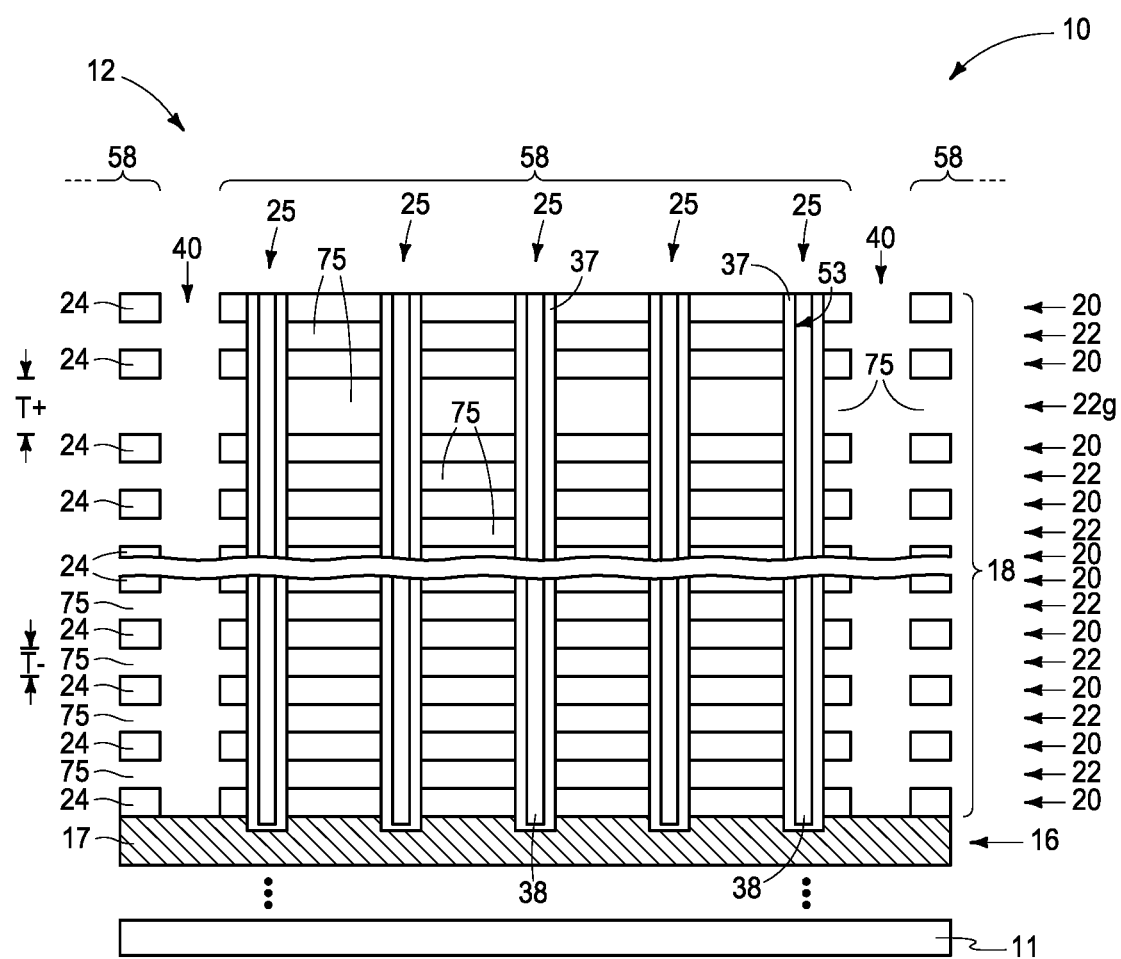
FIGS. 5-22 are diagrammatic sequential sectional and/or enlarged views of the construction of FIGS. 1-4, or portions thereof or alternate and/or additional embodiments, in process in accordance with some embodiments of the invention.

Referring to FIG. 5, and in one embodiment, material 26 (not shown) has been isotropically etched through horizontally-elongated trenches 40 to form void space 75 in first tiers 22*.

Figure 6:
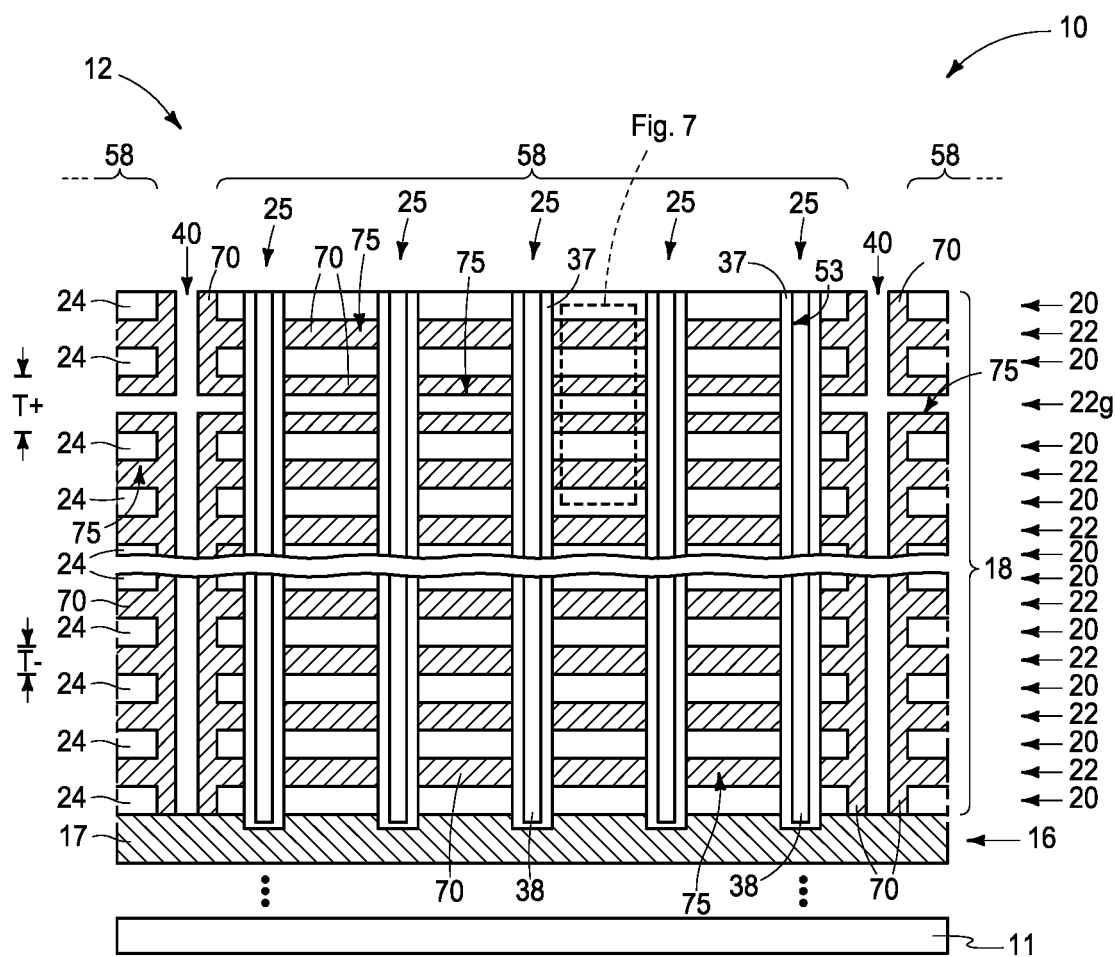
Figure 7:
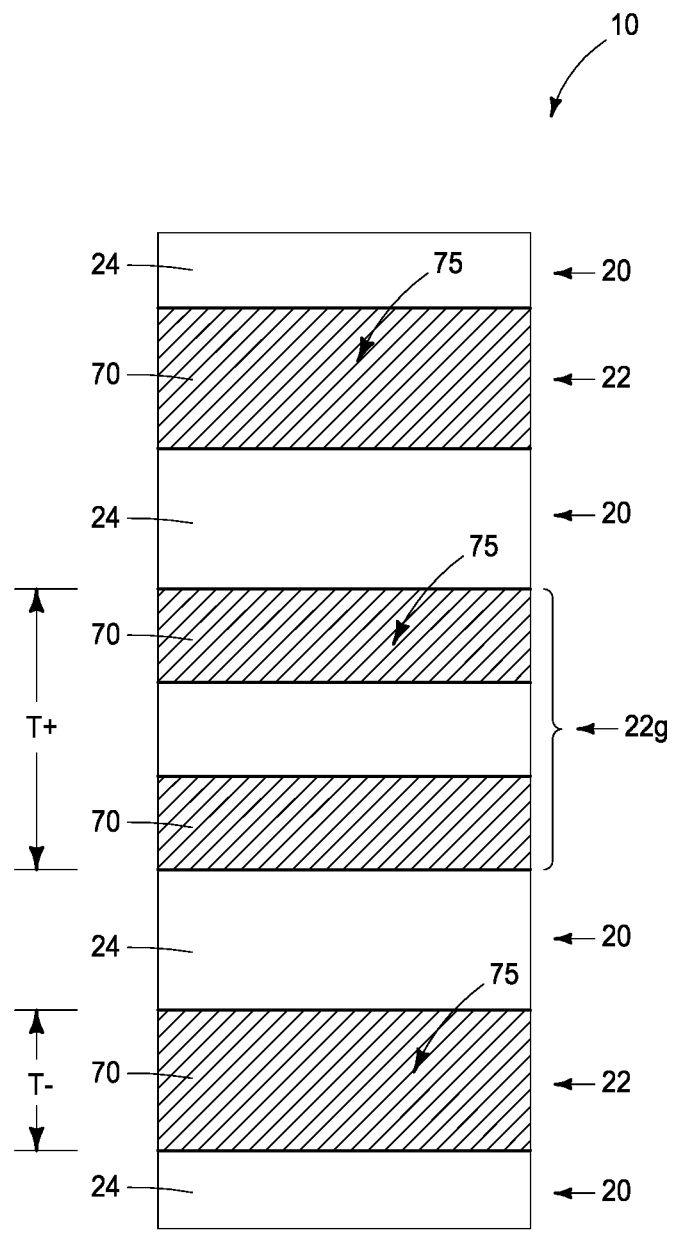

Referring to FIGS. 6 and 7, through horizontally-elongated trenches 40, first conductive material 70 has been formed in void space 75 in two first tiers 22g, 22. First conductive material 70 fills (i.e., completely) first tier 22 of two first tiers 22, 22g that has a smaller of the different vertical thicknesses in individual memory-block regions 58. First conductive material 70 less-than-fills first tier 22g of two first tiers 22g, 22 that has a larger of the different vertical thicknesses in individual memory-block regions 58. Where there are multiple first tiers 22 having smaller of the different vertical thicknesses in individual memory-block regions 58 (regardless of whether all smaller thicknesses are the same), in one embodiment first conductive material 70 is formed in void space 75 in such multiple first tiers 22 to fill such void space 75 in individual memory-block regions 58.

Figure 8:
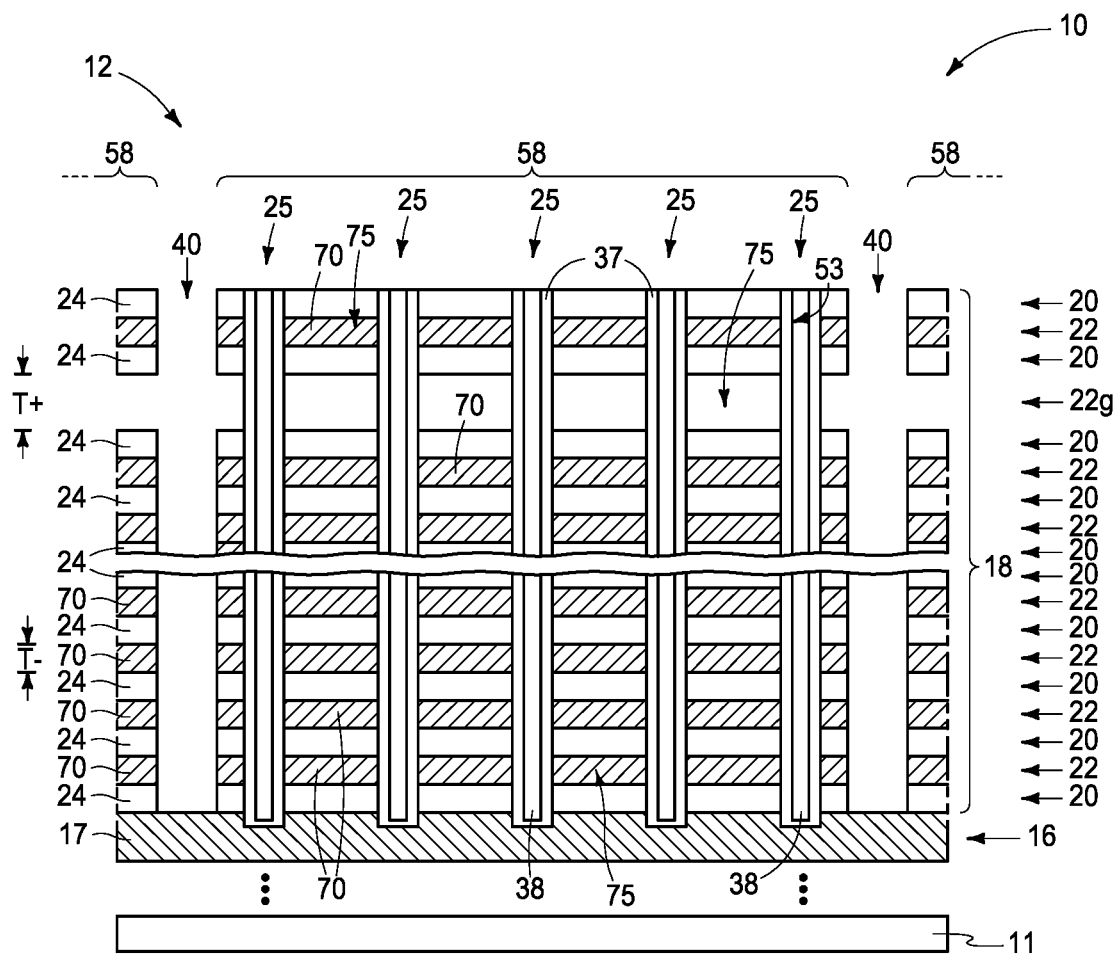
Figure 9:
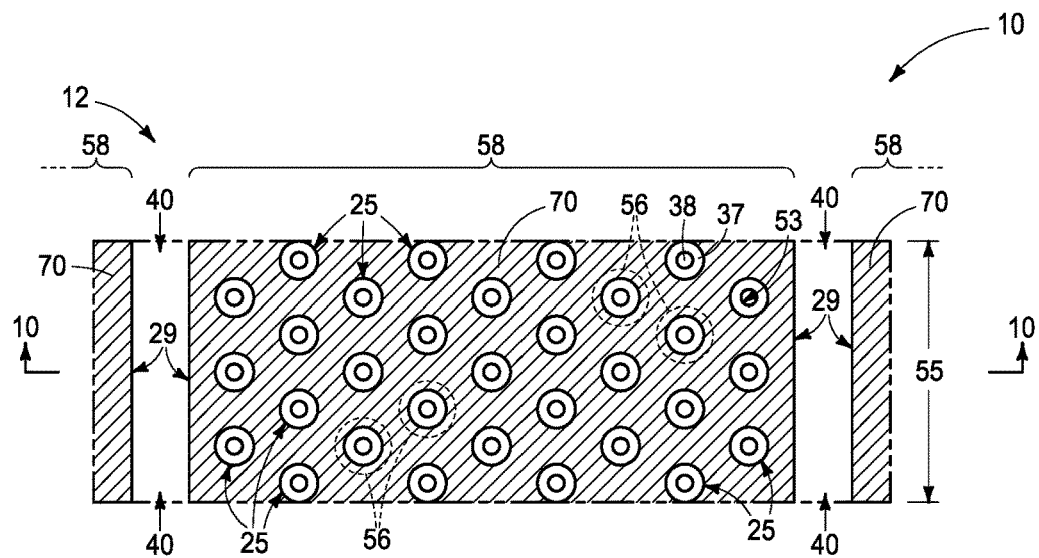
Figure 10:
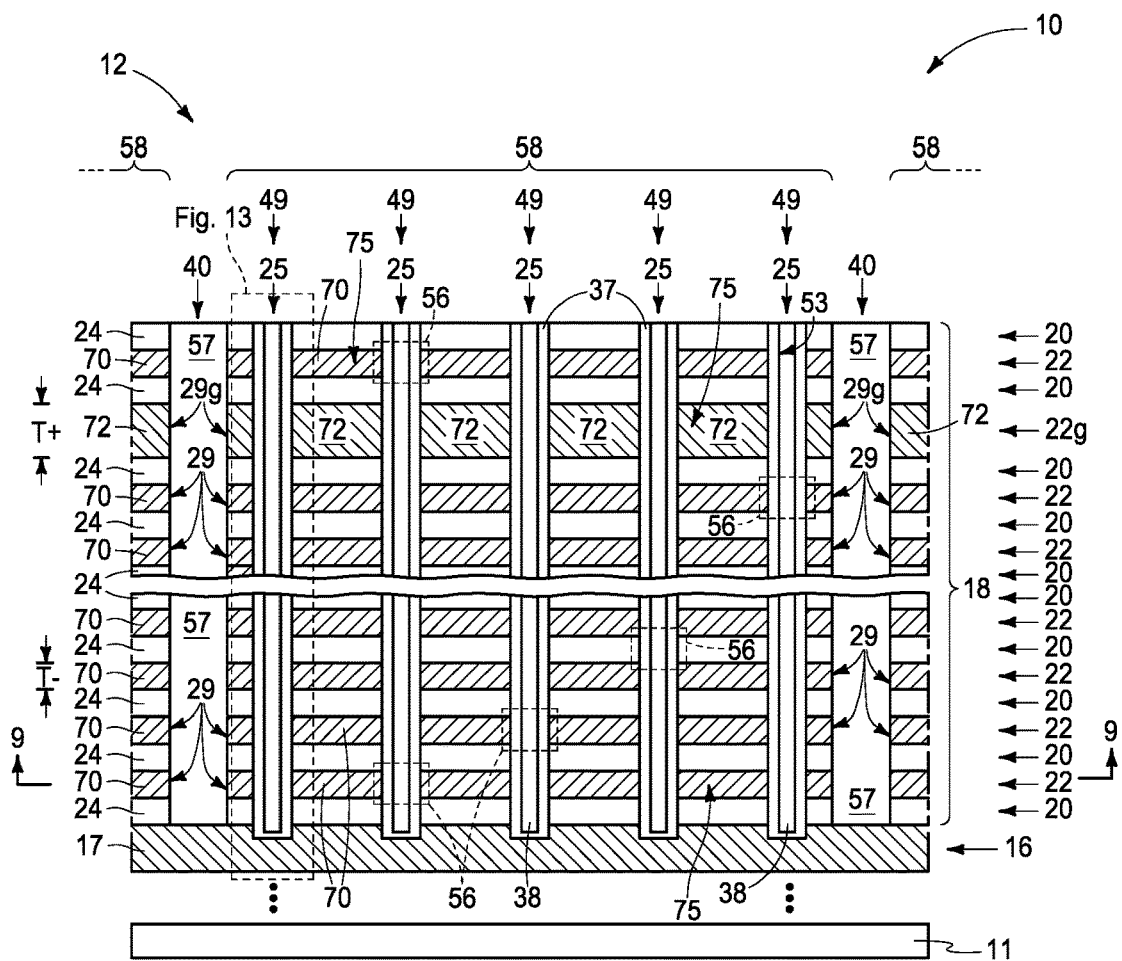
Figure 11:
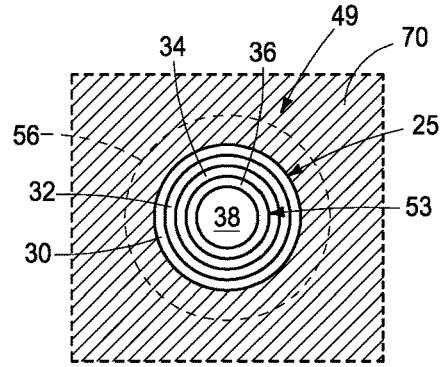
Figure 12:
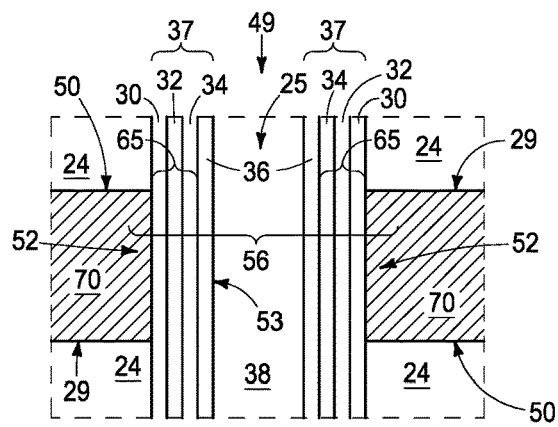
Figure 13:
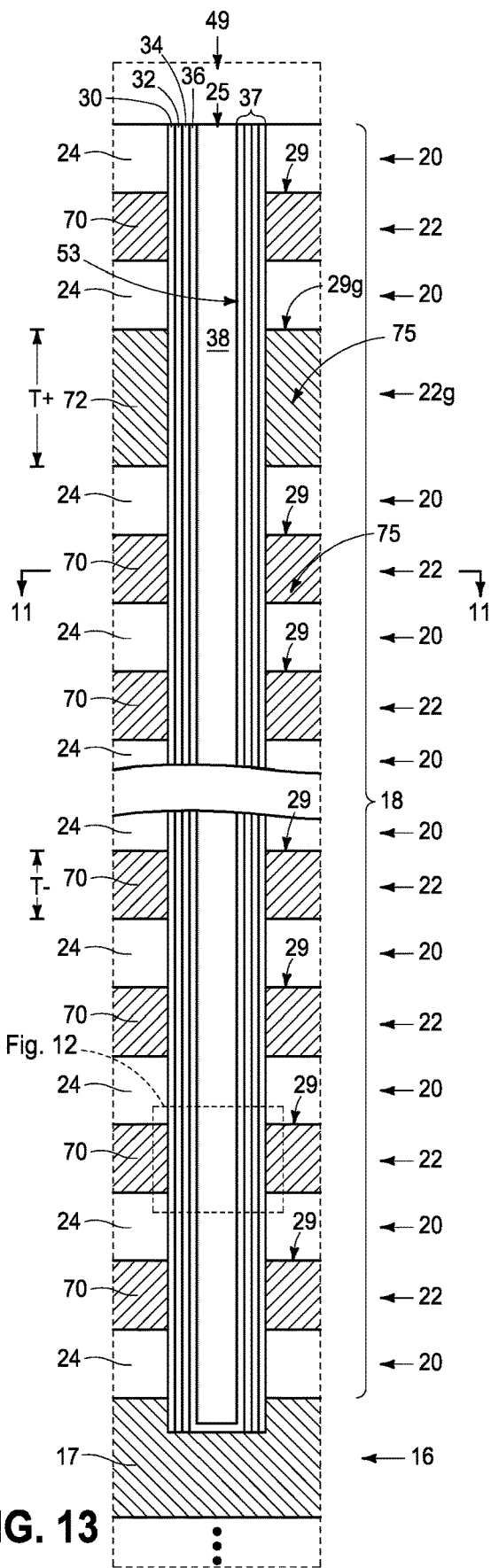

Referring to FIG. 8, through horizontally-elongated trenches 40, first conductive material 70 has been isotropically etched from first tier 22g having the larger vertical thickness in individual memory-block regions 58 to leave first conductive material 70 in first tier 22 having the smaller vertical thickness in individual memory-block regions 58. Where there are multiple first tiers 22 having smaller of the different vertical thicknesses in individual memory-block regions 58 (regardless of whether all smaller thicknesses are the same), in one embodiment the isotropically etching of first conductive material 70 leaves first conductive material 70 in such multiple smaller-vertical-thickness first tiers 22 in individual memory-block regions 58. Ideally and as shown, first conductive material 70 has been removed from being in horizontally-elongated trenches 40.

Referring to FIGS. 9-13, after the isotropically etching of first conductive material 70 and through horizontally-elongated trenches 40, second conductive material 72 has been formed in first tier 22g having the larger vertical thickness in individual memory-block regions 58. In one embodiment, first conductive material 70 and second conductive material 72 are of different compositions relative one another and in another embodiment are of the same composition relative one another. In one embodiment and as shown, the forming of second conductive material 72 fills first tier 22g having the larger vertical thickness in individual memory-block regions 58. In one embodiment, first tier 22g having the larger vertical thickness in individual memory-block regions 58 is a select gate tier that is above or below the memory cells being formed (e.g., all of them) and in one such embodiment second conductive material 72 comprises conductively-doped polysilicon. In one embodiment, first tier 22g having the larger vertical thickness in individual memory-block regions 58 is an operative wordline tier.

Ideally and as shown, second conductive material 72 has been removed from being in horizontally-elongated trenches 40. In one embodiment, individual conductive lines 29, 29g (e.g., gate lines; e.g., wordlines) and elevationally-extending strings 49 of individual transistors and/or memory cells 56 have been formed.

A thin insulative liner (e.g., $Al_2O_3$ and not shown) may be formed before forming one or both of conductive materials 70, 72. Approximate locations of some transistors and/or some memory cells 56 are indicated with a bracket or with dashed outlines, with transistors and/or memory cells 56 being essentially ring-like or annular in the depicted example, Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conductive materials 70 and/or 72 as part of a transistor and/or memory cell 56 may be considered as having terminal ends 50 corresponding to control-gate regions 52 of individual transistors and/or memory cells 56. Control-gate regions 52 in the depicted embodiment comprise individual portions of individual conductive lines 29, 29g. Materials 30, 32, and 34 may be considered as a memory structure 65 that is laterally between control-gate region 52 and channel material 36. In one embodiment and as shown with respect to the example "gate-last" processing, conductive materials 70, 72 of conductive tiers 22* is formed after forming openings 25. Alternately, such may be formed before forming channel openings 25, for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conductive material 70 and/or 72), Regardless, as an additional example, an interface of a storage material and conductive material of a control gate may be sufficient to function as a charge-blocking region in the absence of any separate-composition-insulator material 30, Further, an interface of conductive material 70 and/or 72 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22* from shorting relative one another in a finished circuitry construction. Example insulative materials are one or more of $SiO_2$, $Si_3N_4$, $Al_2O_3$, and undoped polysilicon. Intervening material 57 may include through array vias (not shown).

Any other attribute(s) or aspect(s) as shown and/or described herein with respect to other embodiments may be used in the embodiments shown and described with reference to the above embodiments.

An alternate example embodiment is described with reference to FIGS. 14-20 and a construction 10a. Like numerals from the above-described embodiments have been used where appropriate, with some construction differences being indicated with the suffix "a" or with different numerals. FIGS. 14-20 for clarity and ease of depiction are of the scale of FIG. 7.

Figure 14:
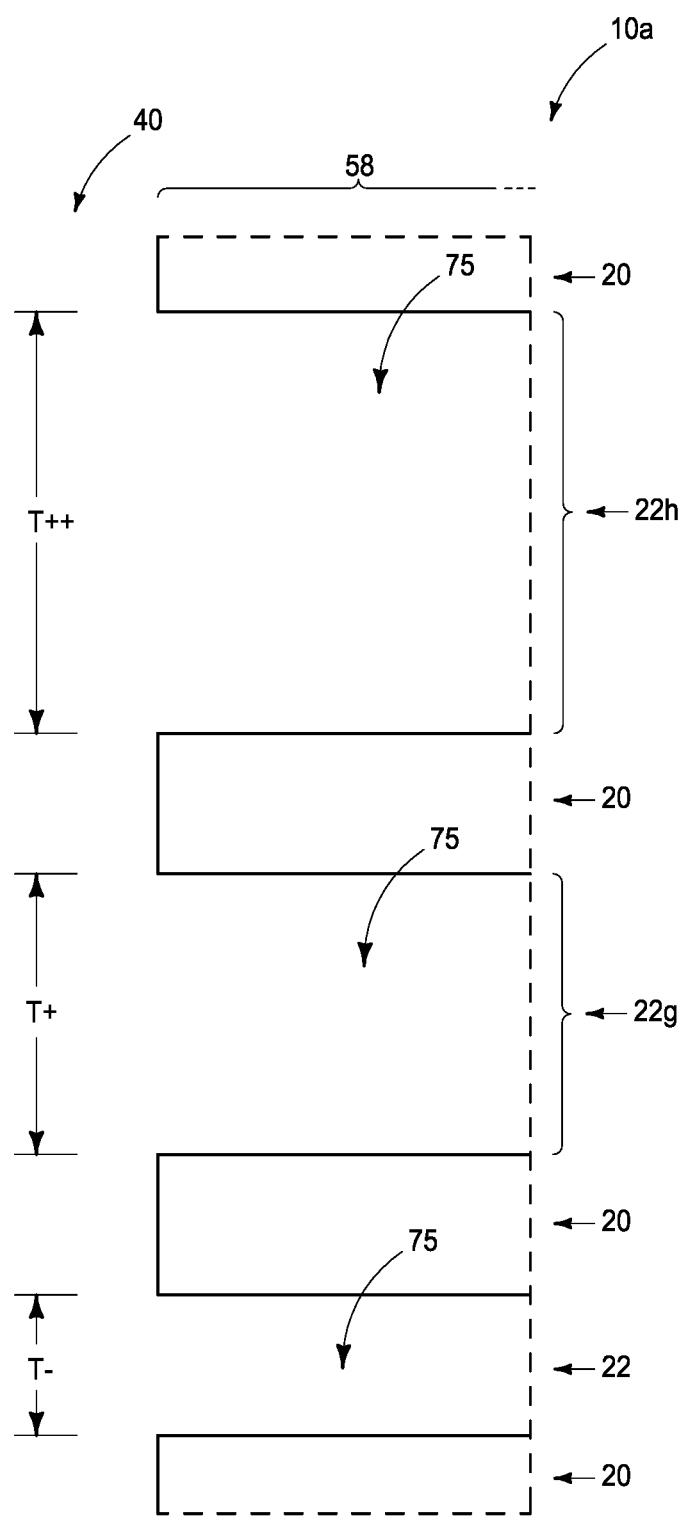

FIG. 14 shows another first tier 22h having a vertical thickness T++ that is larger than thickness T+ of first tier 22g having the larger vertical thickness as compared to thickness T−.

Figure 15:
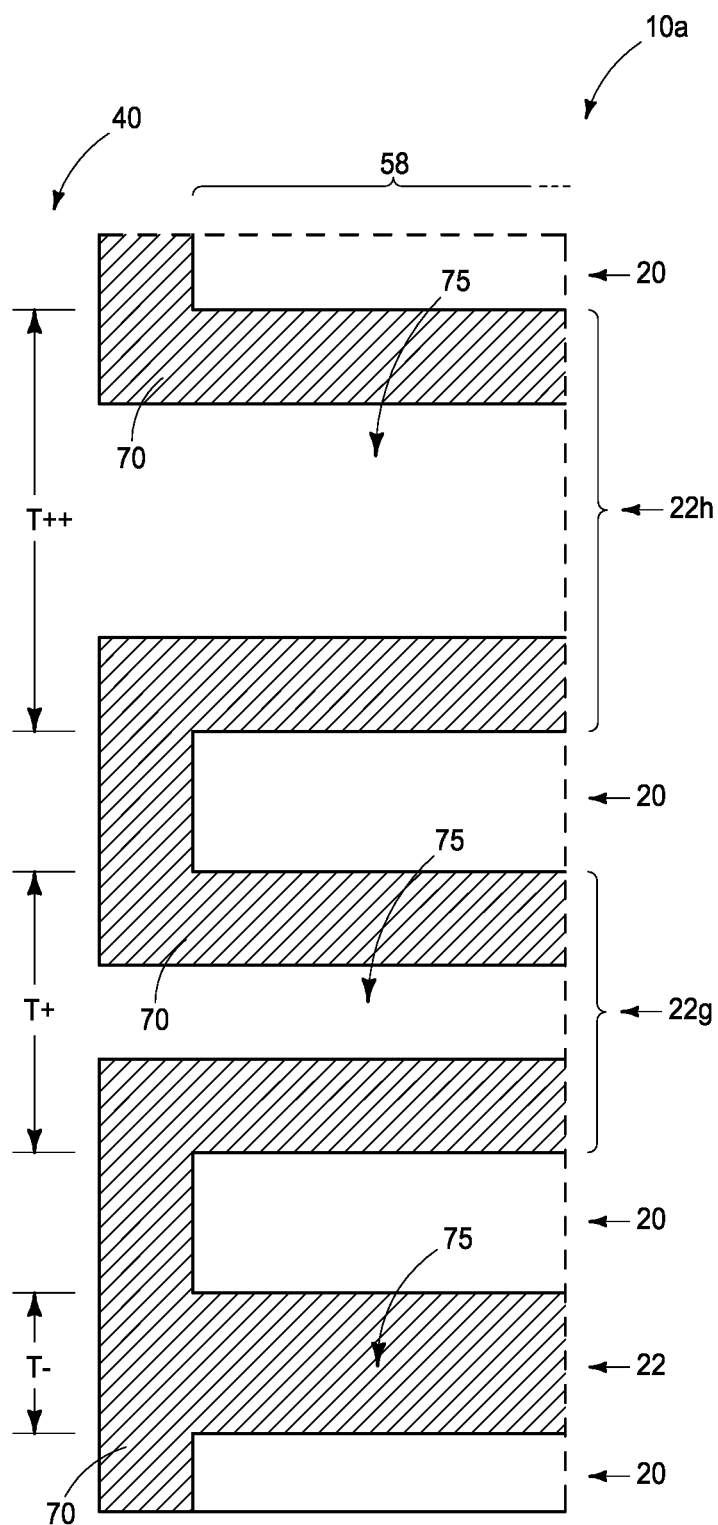

Referring to FIG. 15, analogous processing to that of FIGS. 6 and 7 is shown. First conductive material 70 has additionally been formed in void space 75 in another first tier 22h to less-than-fill another first tier 22h in individual memory-block regions 58.

Figure 16:
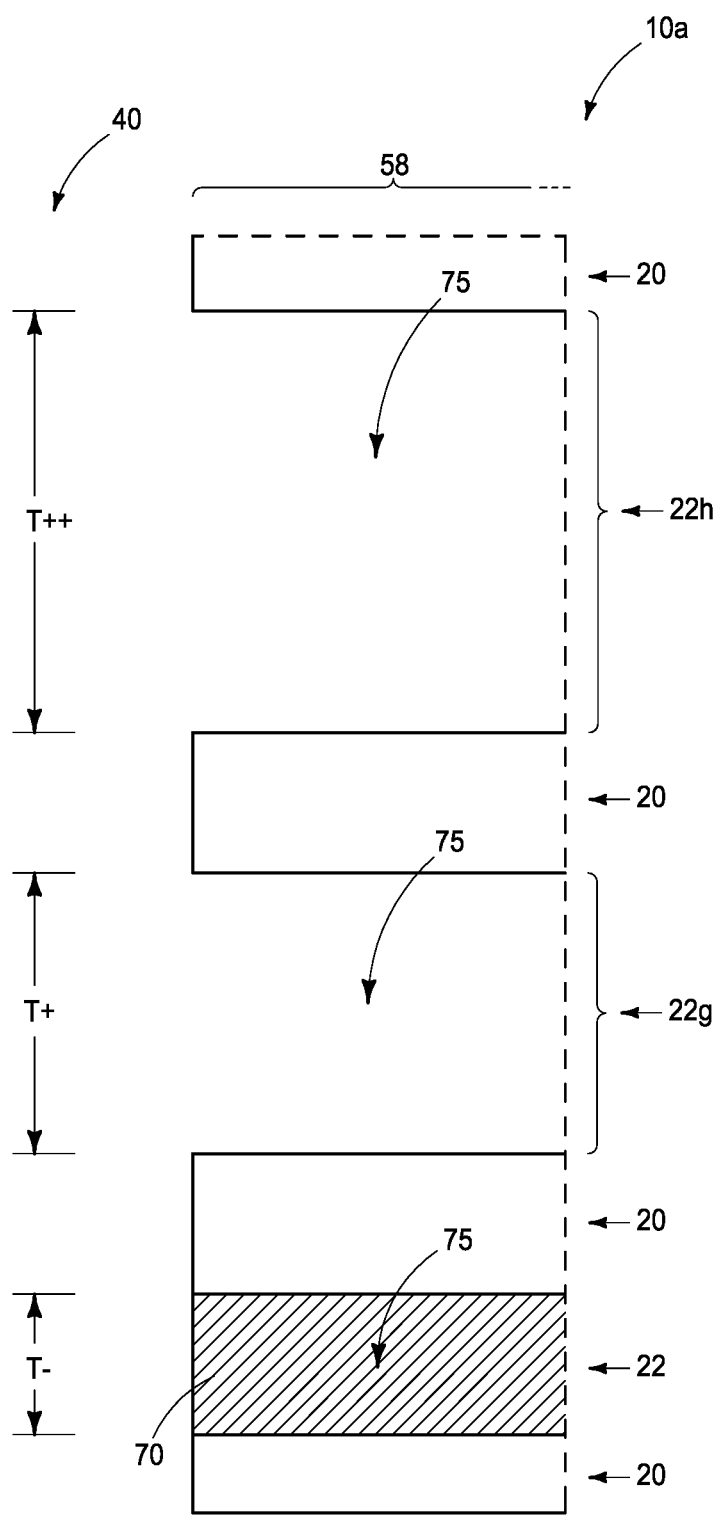

Referring to FIG. 16, the isotropically etching of first conductive material 70 as described and shown above with respect to FIG. 8 has also removed first conductive material 70 from another first tier 22h in individual memory-block regions 58.

Figure 17:
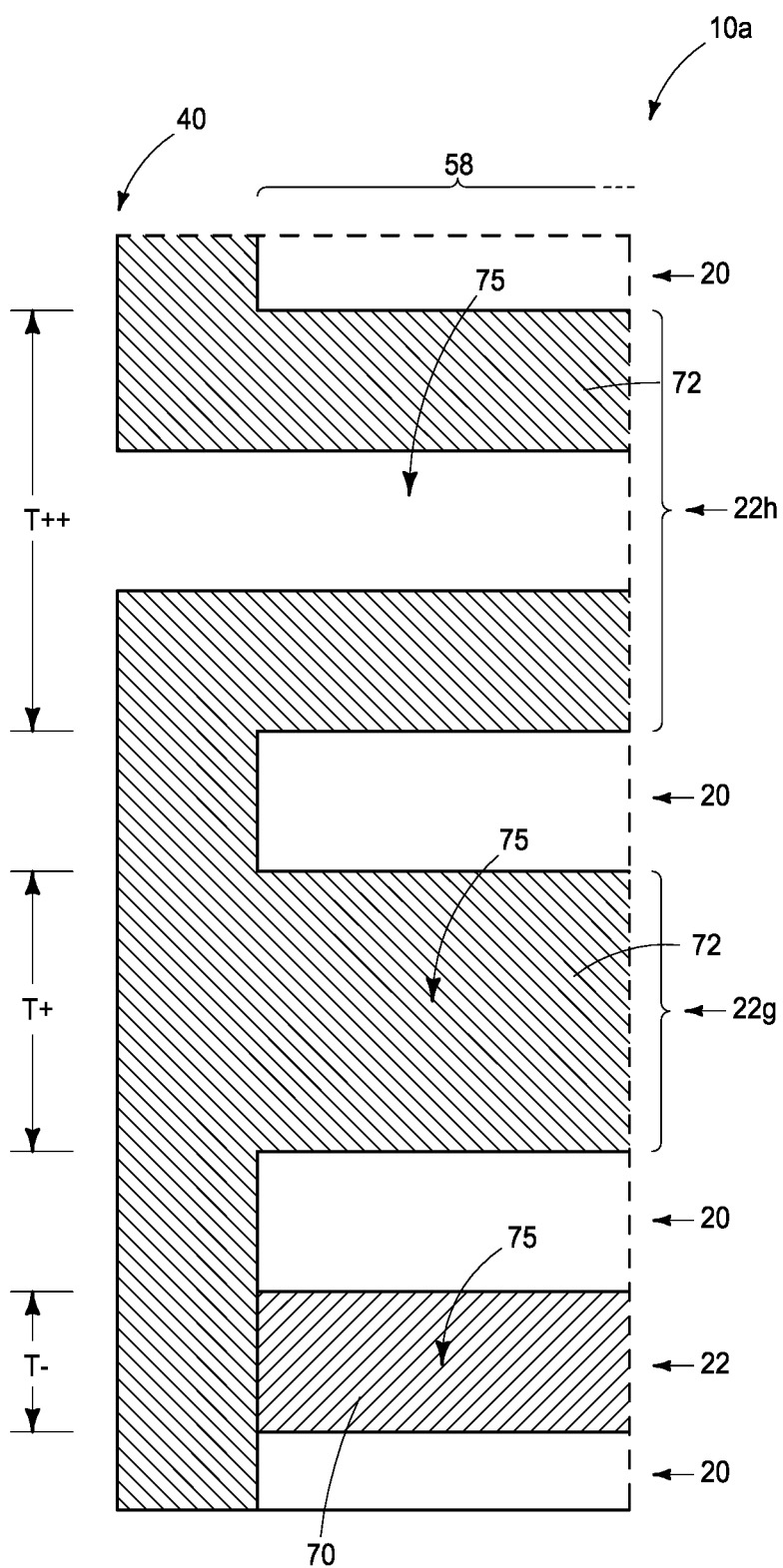

Referring to FIG. 17, second conductive material 72 as described and shown above with respect to FIG. 10 has also been formed to within another first tier 22h in individual memory block regions 58. In one embodiment and as shown, the forming of second conductive material 72 fills first tier 22g having larger vertical thickness T+ in individual memory-block regions 58 and less-than-fills another first tier 22h in individual memory-block regions 58.

Figure 18:
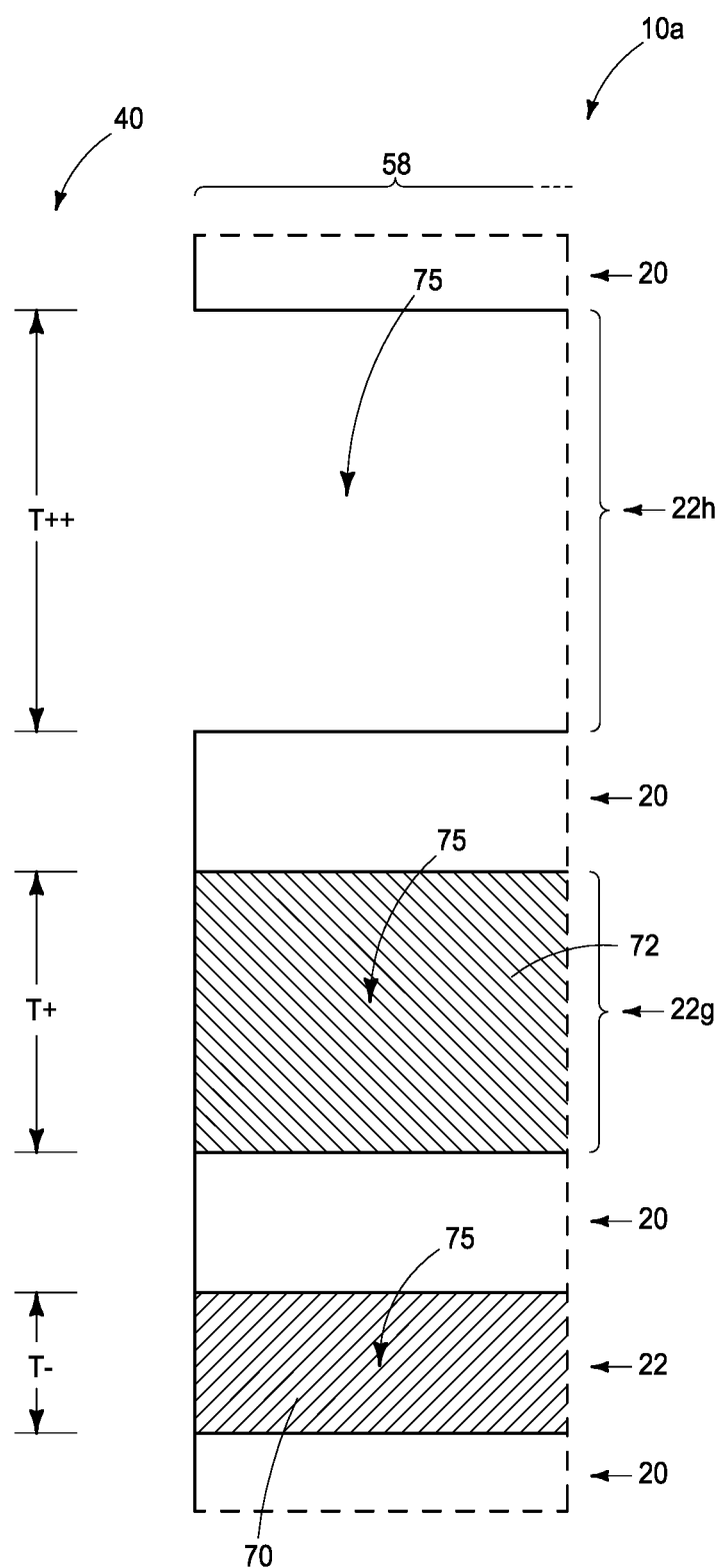

Referring to FIG. 18, after forming second conductive material 72 and through horizontally-elongated trenches 40, second conductive material 72 has been isotropically etched from another first tier 22h in individual memory-block regions 58 to leave second conductive material 72 in first tier 22g having larger vertical thickness T+ in individual memory-block regions 58 and to leave first conductive material 70 in first tier 22 having smaller vertical thickness T− in individual memory-block regions 58.

Figure 19:
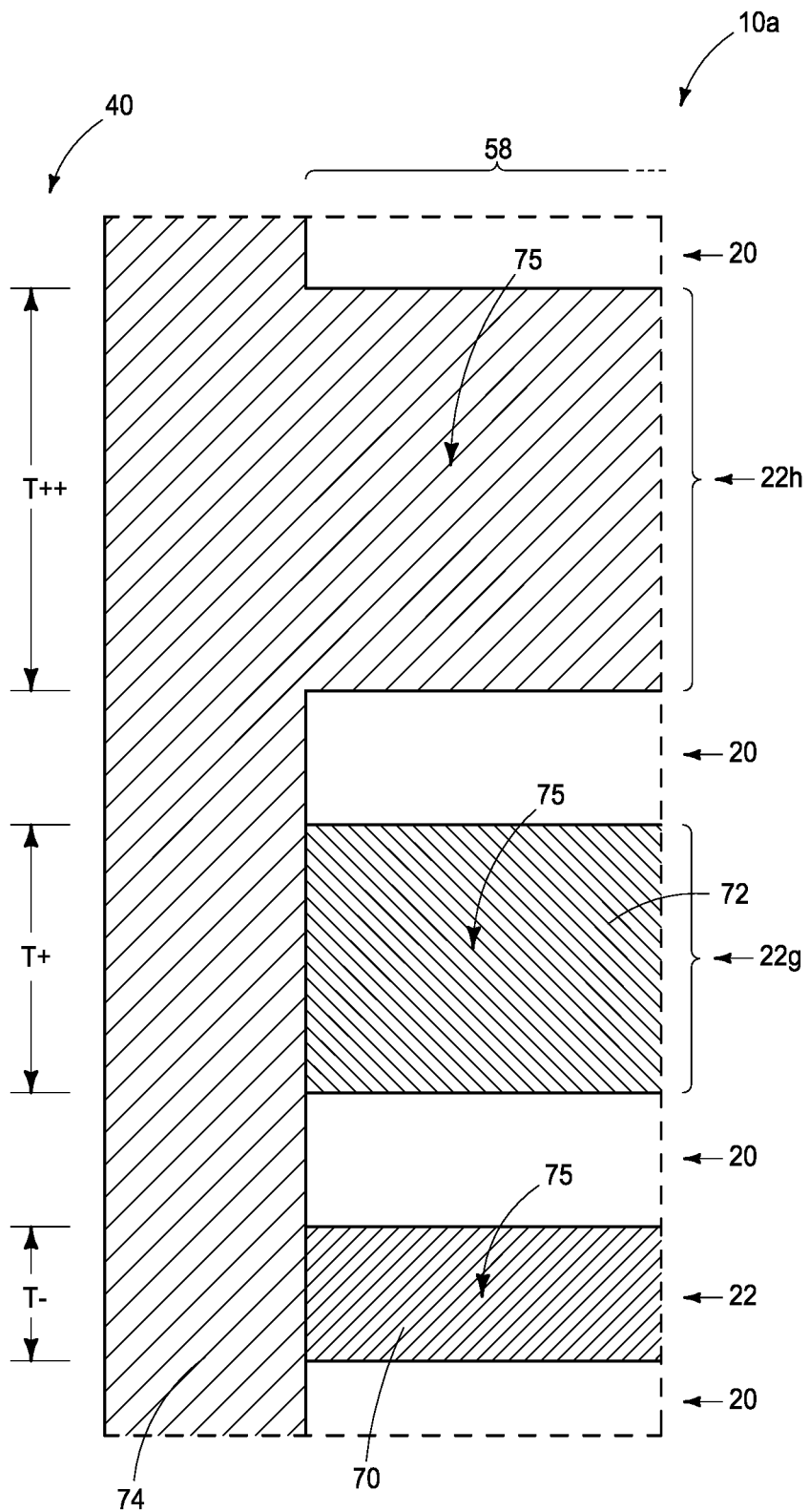

Referring to FIG. 19, after the isotropically etching of second conductive material 72 and through horizontally-elongated trenches 40, third conductive material 74 has been formed in another first tier 22h in individual memory-block regions 58 (e.g., in one embodiment to fill such tier 22h). In one embodiment, second conductive material 72 and third conductive material 74 are of different compositions relative one another. In one embodiment, first conductive material 70, second conductive material 72, and third conductive material 74 are of different compositions relative one another.

Figure 20:
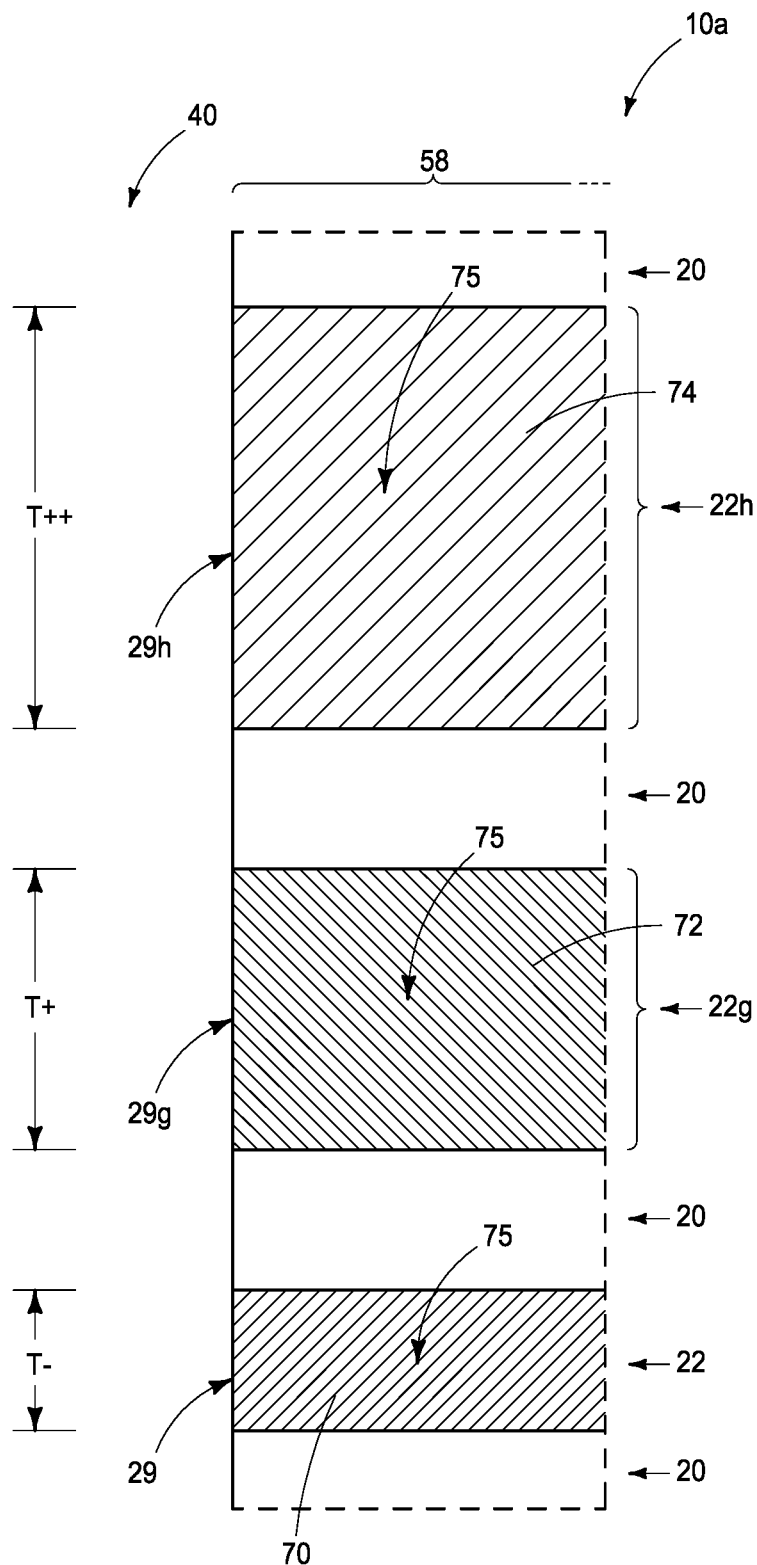

FIG. 20 shows removal of third conductive material 74 from trenches 40 and the forming of a conductive line 29h in another first tier 22h.

Any other attribute(s) or aspect(s) as shown and/or described herein with respect to other embodiments may be used.

Figure 21:
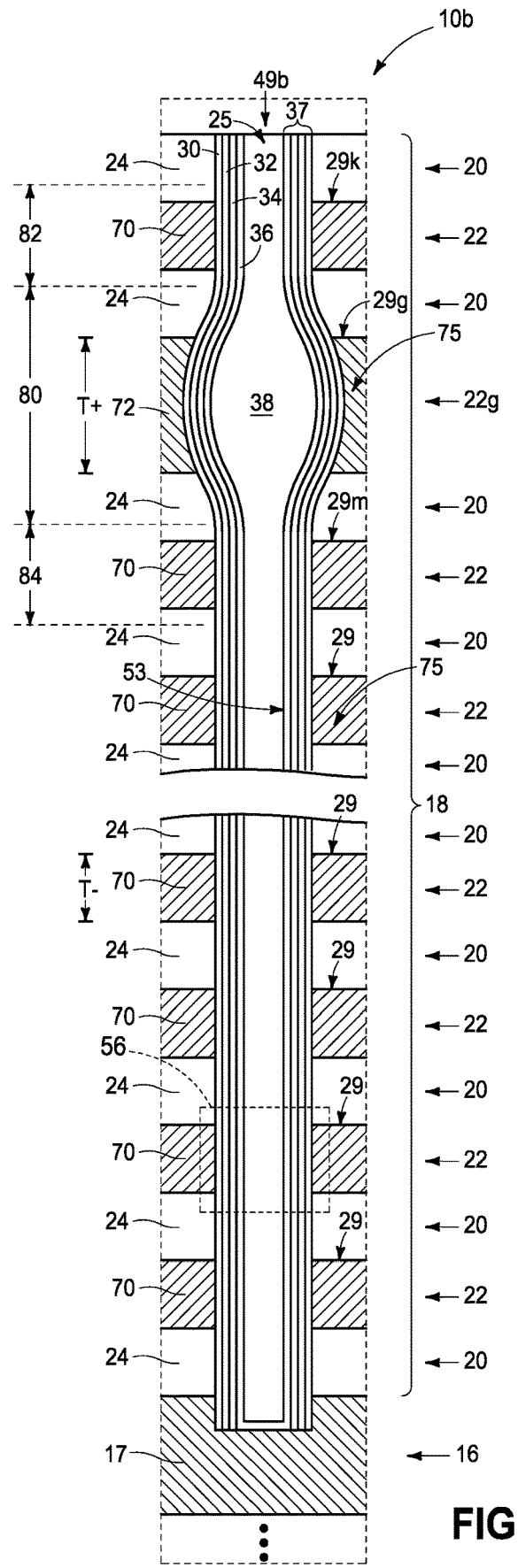

An alternate example embodiment is described with reference to FIG. 21 and a construction 10b. Like numerals from the above-described embodiments have been used where appropriate, with some construction differences being indicated with the suffix "b" or with different numerals. FIG. 21 for clarity and is of depiction is of the same scale as FIG. 13 and shows a finished construction. The artisan will recognize how and where such may manifest in method embodiments.

Channel-material strings 53 in a vertical region 80 project laterally outward compared to a portion 82 of the channel-material strings that is immediately-above vertical region 80 and compared to a portion 84 of the channel-material strings 53 that is immediately-below vertical region 80 ("immediately-above" and "immediately-below" meaning there being no other portion between [a] vertical region 80 and portion 82, and [b] vertical region 80 and portion 84, respectively). At least a majority of all of first tiers 22* herein up to and including all of such) in a finished construction of the memory array comprises conductive tiers 22* comprising conductive gate lines 29* that are individually operatively laterally proximate channel-material strings 53 in individual conductive tiers 22*. Such referred-to conductive gate lines 29* comprise part of some of the memory cells 56 in that individual conductive tier 22*. One of conductive gate lines 29* (e.g., 29g) is in vertical region 80 in first tier 22g having larger vertical thickness T+ in individual memory-block regions 58 and is vertically thicker than another of conductive gate lines 29* (e.g., 29k) that is immediately-above vertical region 80 and another conductive gate line 29* (e.g., 29m) that is immediately-below vertical region 80. Cause of channel-material strings 53 to project laterally outward particularly somewhere in an upper third of stack 18 may be an artifact of manufacture when forming channel openings 25. As such reduces lateral space between immediately-laterally-adjacent memory cells 56, volume of the conductive material of gate lines 29* in such vertical regions 80 also reduces, thus increasing resistance of such gate lines. Such may be overcome by increasing vertical thickness of such gate lines.

Any other attribute(s) or aspect(s) as shown and/or described herein with respect to other embodiments may be used.

In one embodiment, a method in accordance with the invention comprises forming a stack (e.g., 18) comprising vertically-alternating first tiers 22\*) and second tiers (e.g., 20\*, and regardless of whether comprising memory circuitry in fabrication and regardless of whether comprising memory-block regions even if so comprising). Two of the first tiers (e.g., 22, 22g) have different vertical thicknesses (e.g., T+, T−) relative one another. First conductive material (e.g., 70) is formed in void space (e.g., 75) in the two first tiers. The first conductive material in a vertical cross-section (e.g., that of FIGS. 6 and 7) fills the first tier of the two first tiers that has a smaller of the different vertical thicknesses. The first conductive material in the vertical cross-section less-than-fills the first tier of the two first tiers that has a larger of the different vertical thicknesses. The first conductive material is isotropically etched from the first tier having the larger vertical thickness in the vertical cross-section to leave the first conductive material in the first tier having the smaller vertical thickness in the vertical cross-section. After the isotropically etching, second conductive material (e.g., 72) is formed in the first tier having the larger vertical thickness in the vertical cross-section. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

Figure 22:
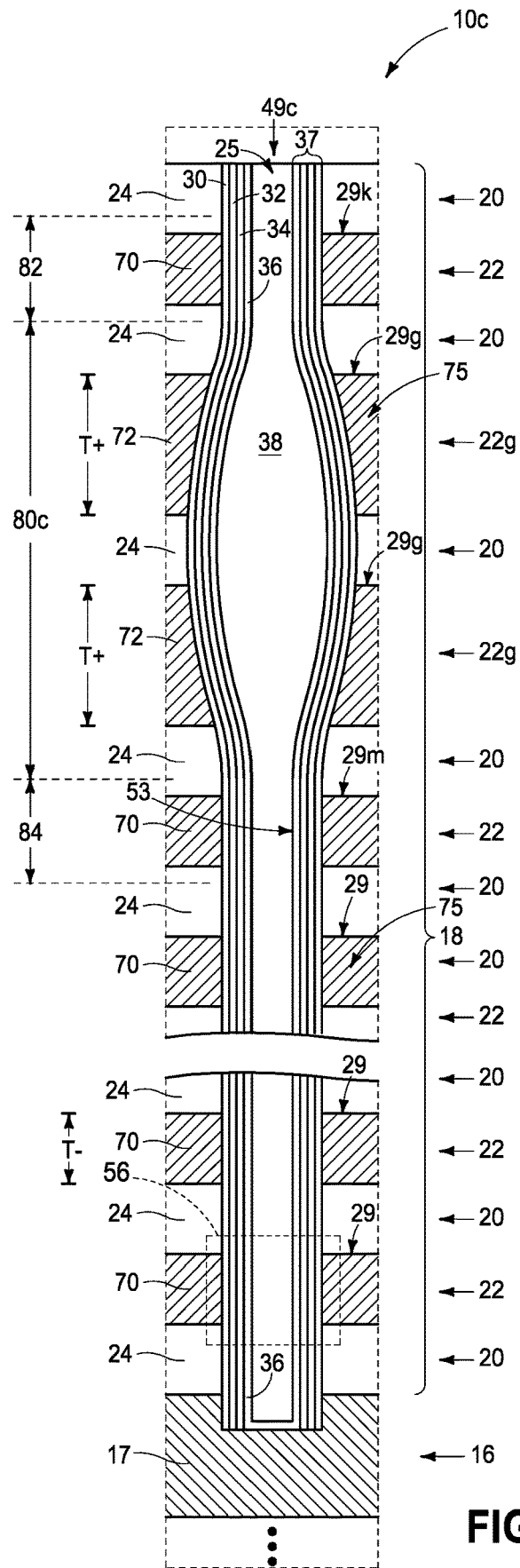

In one embodiment, a memory array (e.g., 12) comprising strings (e.g., 49\*) of memory cells (e.g., 56) comprises a vertical stack (e.g., 18) comprising alternating insulative tiers (e.g., 20\*) and conductive tiers (e.g., 22\*). Channel-material strings (e.g., 53) of memory cells (e.g., 56) extend through the insulative tiers and the conductive tiers. The channel-material strings in a vertical region (e.g., 80 or 80c) project laterally outward in a vertical cross-section (e.g., that of FIG. 21 or 22) compared to a portion (e.g., 82) of the channel-material strings that is immediately-above the vertical region and compared to a portion (e.g., 84) of the channel-material strings that is immediately-below the vertical region. The conductive tiers comprise conductive gate lines (e.g., 29\*) that are individually operatively laterally proximate the channel-material strings in individual of the conductive tiers. The conductive gate lines comprise part of some of the memory cells in that individual conductive tier. One of the conductive gate lines (e.g., 29g) that is in the vertical region is vertically thicker than another of the conductive gate lines (e.g., 29k) that is immediately-above the vertical region and another of the conductive gate lines (e.g., 29m) that is immediately-below the vertical region.

In one embodiment, the one conductive gate line that is in the vertical region is vertically thicker than at least a majority of the conductive gate lines that are individually operatively laterally proximate the channel-material strings that are immediately-above and immediately-below the vertical region. In one such embodiment, the at least a majority of the conductive gate lines that are individually operatively laterally proximate the channel-material strings in the individual conductive tiers are of the same vertical thickness relative one another.

In one embodiment, there are multiple of the one vertically thicker conductive gate lines in the vertical region. See, for example, construction 10c in 22. Like numerals from the above-described embodiments have been used where appropriate, with some construction differences being indicated with the suffix "c" or with different numerals.

In one embodiment, a select gate tier is above or below the memory cells and has larger vertical thickness than thickness of the another conductive gate line that is immediately-above the vertical region and the another conductive gate line that is immediately-below the vertical region. In one such embodiment, the select gate tier comprises a conductive select gate line that comprises conductively-doped polysilicon.

In one embodiment, the one conductive gate line that is vertically thicker is a dummy wordline. In one embodiment, the one conductive gate line that is vertically thicker is an operative wordline tier Any other attribute(s) or aspect(s) as shown and/or described herein with respect to other embodiments may be used.

The above processing(s) or constructions) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components), Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers comprising laterally-spaced memory-block regions having horizontally-elongated trenches there-between. Two of the first tiers have different vertical thicknesses relative one another. Channel-material strings of memory cells extend through the first tiers and the second tiers. Through the horizontally-elongated trenches, first conductive material is formed in void space in the two first tiers. The first conductive material fills the first tier of the two first tiers that has a smaller of the different vertical thicknesses in individual of the memory-block regions. The first conductive material less-than-fills the first tier of the two first tiers that has a larger of the different vertical thicknesses in the individual memory-block regions. Through the horizontally-elongated trenches, the first conductive material is isotropically etched from the first tier having the larger vertical thickness in the individual memory-block regions to leave the first conductive material in the first tier having the smaller vertical thickness in the individual memory-block regions. After the isotropically etching of the first conductive material and through the horizontally-elongated trenches, second conductive material is formed in the first tier having the larger vertical thickness in the individual memory-block regions.

In some embodiments, a method comprises forming a stack comprising vertically-alternating first tiers and second tiers. Two of the first tiers have different vertical thicknesses relative one another. First conductive material is formed in void space in the two first tiers. The first conductive material in a vertical cross-section fills the first tier of the two first tiers that has a smaller of the different vertical thicknesses. The first conductive material in the vertical cross-section less-than-fills the first tier of the two first tiers that has a larger of the different vertical thicknesses. The first conductive material is isotropically etched from the first tier having the larger vertical thickness in the vertical cross-section to leave the first conductive material in the first tier having the smaller vertical thickness in the vertical cross-section. After the isotropically etching, second conductive material is formed in the first tier having the larger vertical thickness in the vertical cross-section.

In some embodiments, a memory array comprising strings of memory cells comprises a vertical stack comprising alternating insulative tiers and conductive tiers. Channel-material strings of memory cells extend through the insulative tiers and the conductive tiers. The channel-material strings in a vertical region project laterally outward compared to a portion of the channel-material strings that is immediately-above the vertical region and compared to a portion of the channel-material strings that is immediately-below the vertical region. The conductive tiers comprise conductive gate lines that are individually operatively laterally proximate the channel-material strings in individual of the conductive tiers. The conductive gate lines comprise part of some of the memory cells in that individual conductive tier. One of the conductive gate lines that is in the vertical region is vertically thicker than another of the conductive gate lines that is immediately-above the vertical region and another of the conductive gate lines that is immediately-below the vertical region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a stack comprising vertically-alternating first tiers and second tiers comprising laterally-spaced memory-block regions having horizontally-elongated trenches there-between, two of the first tiers having different vertical thicknesses relative one another, channel-material strings of memory cells extending through the first tiers and the second tiers;
    through the horizontally-elongated trenches, forming first conductive material in void space in the two first tiers, the first conductive material filling the first tier of the two first tiers that has a smaller of the different vertical thicknesses in individual of the memory-block regions, the first conductive material less-than-filling the first tier of the two first tiers that has a larger of the different vertical thicknesses in the individual memory-block regions;
    through the horizontally-elongated trenches, isotropically etching the first conductive material from the first tier having the larger vertical thickness in the individual memory-block regions to leave the first conductive material in the first tier having the smaller vertical thickness in the individual memory-block regions; and
    after the isotropically etching of the first conductive material and through the horizontally-elongated trenches, forming second conductive material in the first tier having the larger vertical thickness in the individual memory-block regions.

2. The method of claim 1 wherein the first and second conductive materials are of different compositions relative one another.

3. The method of claim 1 wherein the first and second conductive materials are of the same composition relative one another.

4. The method of claim 1 wherein forming the second conductive material fills the first tier having the larger vertical thickness in the individual memory-block regions.

5. The method of claim 1 wherein forming the second conductive material less-than-fills the first tier having the larger vertical thickness in the individual memory-block regions.

6. The method of claim 1 wherein the first tier having the larger vertical thickness in the individual memory-block regions is a select gate tier that is above or below the memory cells.

7. The method of claim 6 wherein the second conductive material comprises conductively-doped polysilicon.

8. The method of claim 1 wherein the first tier having the larger vertical thickness in the individual memory-block regions is a dummy wordline tier.

9. The method of claim 1 wherein the first tier having the larger vertical thickness in the individual memory-block regions is an operative wordline tier.

10. The method of claim 1 wherein,
    the channel-material strings in a vertical region project laterally outward compared to a portion of the channel-material strings that is immediately-above the vertical region and compared to a portion of the channel-material strings that is immediately-below the vertical region; and
    at least a majority of all of the first tiers in a finished construction of the memory array comprise conductive tiers comprising conductive gate lines that are individually operatively laterally proximate the channel-material strings in individual of the conductive tiers, the conductive gate lines comprising part of some of the memory cells in that individual conductive tier, one of the conductive gate lines that is in the vertical region being in the first tier having the larger vertical thickness in the individual memory-block regions and being vertically thicker than another of the conductive gate lines that is immediately-above the vertical region and another of the conductive gate lines that is immediately-below the vertical region.

11. The method of claim 1 wherein the void space in the first two tiers is formed at least in part by isotropically etching sacrificial material therein through the horizontally-elongated trenches.

12. The method of claim 1 wherein multiple of the first tiers have smaller of the different vertical thicknesses in the individual memory-block regions and into which the first conductive material is formed to fill void space in said multiple in the individual memory-block regions, the isotropically etching of the first conductive material leaving the first conductive material in said multiple smaller-vertical-thickness first tiers in the individual memory-block regions.

13. The method of claim 1 comprising:
another first tier having a vertical thickness that is larger than the thickness of the first tier having the larger vertical thickness;
the first conductive material being formed in void space in the another first tier to less-than-fill the another first tier in the individual memory-block regions;
the isotropically etching of the first conductive material removing the first conductive material from the another first tier in the individual memory-block regions; and
the forming of the second conductive material also being to within the another first tier in the individual memory block regions.

14. The method of claim 13 wherein forming the second conductive material fills the first tier having the larger vertical thickness in the individual memory-block regions and less-than-fills the another first tier in the individual memory-block regions.

15. The method of claim 14 comprising:
after forming the second conductive material and through the horizontally-elongated trenches, isotropically etching the second conductive material from the another first tier in the individual memory-block regions to leave the second conductive material in the first tier having the larger vertical thickness in the individual memory-block regions and to leave the first conductive material in the first tier having the smaller vertical thickness in the individual memory-block regions; and
after the isotropically etching of the second conductive material and through the horizontally-elongated trenches, forming third conductive material in the another first tier in the individual memory-block regions.

16. The method of claim 15 wherein the second and third conductive materials are of different compositions relative one another.

17. The method of claim 15 wherein the first, second, and third conductive materials are of different compositions relative one another.

18. A method comprising:
forming a stack comprising vertically-alternating first tiers and second tiers, two of the first tiers having different vertical thicknesses relative one another;
forming first conductive material in void space in the two first tiers, the first conductive material in a vertical cross-section filling the first tier of the two first tiers that has a smaller of the different vertical thicknesses, the first conductive material in the vertical cross-section less-than-filling the first tier of the two first tiers that has a larger of the different vertical thicknesses;
isotropically etching the first conductive material from the first tier having the larger vertical thickness in the vertical cross-section to leave the first conductive material in the first tier having the smaller vertical thickness in the vertical cross-section; and after the isotropically etching, forming second conductive material in the first tier having the larger vertical thickness in the vertical cross-section.

19. The method of claim 18 wherein the void space in the first two tiers is formed at least in part by isotropically etching sacrificial material therein.

20. The method of claim 18 wherein the first and second conductive materials are of different compositions relative one another.

21. The method of claim 18 wherein the first and second conductive materials are of the same composition relative one another.

22. The method of claim 18 wherein forming the second conductive material fills the first tier having the larger vertical thickness in the vertical cross section.

23. The method of claim 18 wherein forming the second conductive material less-than-fills the first tier having the larger vertical thickness in the vertical cross-section.

24. The method of claim 18 wherein multiple of the first tiers have smaller of the different vertical thicknesses in vertical cross-section and into which the first conductive material is formed to fill void space in said multiple in the vertical cross-section, the isotropically etching of the first conductive material leaving the first conductive material in said multiple smaller-vertical-thickness first tiers in the vertical cross-section.

25. The method of claim 18 comprising:
another first tier having a vertical thickness that is larger than the than the thickness of the first tier having the larger vertical thickness;
the first conductive material being formed in void space in the another first tier to less-than-fill the another first tier in the vertical cross-section;
the isotropically etching of the first conductive material removing the first conductive material from the another first tier in the vertical cross-section; and
the forming of the second conductive material also being to within the another first tier in the vertical cross-section.

26. The method of claim 25 wherein forming the second conductive material fills the first tier having the larger vertical thickness in the vertical cross-section and less-than-fills the another first tier in the vertical cross-section.

27. The method of claim 26 comprising:
after forming the second conductive material and through the horizontally-elongated trenches, isotropically etching the second conductive material from the another first tier in the vertical cross-section to leave the second conductive material in the first tier having the larger vertical thickness in the vertical cross-section and to leave the first conductive material in the first tier having the smaller vertical thickness in the vertical cross-section; and
after the isotropically etching of the second conductive material and through the horizontally-elongated trenches, forming third conductive material in the another first tier in the vertical cross-section.

28. The method of claim 27 wherein the second and third conductive materials are of different compositions relative one another.

29. The method of claim 27 wherein the first, second, and third conductive materials are of different compositions relative one another.

* * * * *